United States Patent
Kurokawa et al.

Patent Number: 5,738,969
Date of Patent: Apr. 14, 1998

[54] PROCESS FOR TREATING PLATE SURFACE OF LITHOGRAPHIC PRINTING PLATE

[75] Inventors: Hiroyuki Kurokawa; Toshiro Kondo; Yutaka Araki, all of Tokyo, Japan

[73] Assignee: Mitsubishi Paper Mills Limited, Tokyo, Japan

[21] Appl. No.: 812,647

[22] Filed: Mar. 7, 1997

[30] Foreign Application Priority Data

| Mar. 7, 1996 | [JP] | Japan | 8-050300 |
| Mar. 7, 1996 | [JP] | Japan | 8-050301 |
| Apr. 18, 1996 | [JP] | Japan | 8-096328 |

[51] Int. Cl.$^6$ .............. G03F 7/07; G03C 8/32; B44M 5/00
[52] U.S. Cl. .......... 430/204; 430/248; 430/264; 430/302; 101/466
[58] Field of Search ............. 430/204, 248, 430/302, 264; 101/466

[56] References Cited

U.S. PATENT DOCUMENTS

| 5,118,583 | 6/1992 | Kondo et al. | 430/309 |
| 5,258,258 | 11/1993 | Matsubara et al. | 430/204 |
| 5,518,866 | 5/1996 | Coppens et al. | 430/204 |
| 5,525,455 | 6/1996 | Kurokawa et al. | 430/204 |

FOREIGN PATENT DOCUMENTS

| 1 373 415 | 11/1974 | United Kingdom | G03F 7/06 |

*Primary Examiner*—Richard L. Schilling
*Attorney, Agent, or Firm*—Cushman Darby & Cushman IP Group of Pillsbury Madison & Sutro LLP

[57] ABSTRACT

Disclosed is a process for treating a plate surface of a lithographic printing plate, which comprises, after exposing and developing a lithographic printing plate having a support and at least a silver halide emulsion layer and a physical development nuclei layer provided on the support, treating the plate surface of the lithographic printing plate with a plate surface-treating solution containing at least one water-insoluble compound having a mercapto group or a thione group and a compound represented by the following formula (1):

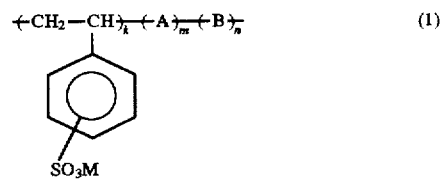

wherein A represents a vinyl monomer unit having a carboxyl group, B represents a copolymerizable ethylenic unsaturated monomer unit, M represents a cation, k represents 30 to 90 mole %, m represents 10 to 50 mole %, and n represents 0 to 50 mole %.

10 Claims, No Drawings

PROCESS FOR TREATING PLATE SURFACE OF LITHOGRAPHIC PRINTING PLATE

BACKGROUND OF THE INVENTION

This invention relates to a process for treating a plate surface of a lithographic printing plate having a support and at least a silver halide emulsion layer and a physical development nuclei layer provided on the support, particularly to a process for treating a plate surface using a neutralizing solution (a stabilizing solution) for neutralizing and stabilizing the plate surface after development processing and an oil sensitivity-imparting solution (an etching solution) for treating a plate surface before starting of printing.

There have already been known lithographic printing plates in which a transferred silver image obtained by the silver complex diffusion transfer process (the DTR process) can be utilized immediately as ink-receptive characteristics. For example, lithographic printing plates having an undercoat layer, a silver halide emulsion layer and a physical development nuclei layer provided on a support have been described in U.S. Pat. No. 3,721,559, No. 3,490,905, No. 3,385,701, No. 3,814,603, No. 3,454,398, No. 3,764,323 and No. 3,099,209, Japanese Patent Publications No. 27242/1969 and No. 30562/1973 and Japanese Provisional Patent Publications No. 9603/1978, No. 21602/1978, No. 103104/1979 and No. 9750/1981. Also, lithographic printing plates having a silver halide emulsion layer on physical development nuclei carried on an aluminum support have been described in U.S. Pat. No. 5,427,889 and Japanese Provisional Patent Publications No. 216236/1993 and No. 81194/1994.

These lithographic printing plates are constituted by oleophilic ink receptive silver image portions and hydrophilic water receptive non-image portions. Accordingly, the customary lithographic printing is carried out by feeding both water and colored ink to a printing plate surface to allow the silver image portions to receive preferentially the colored ink and the non-image portions to receive preferentially water and then transferring the ink deposited on said silver image portions onto a substrate such as paper.

In order to obtain a print of good quality, it is necessary that the difference between oleophilicity of the surfaces of the image portions and hydrophilicity of the surfaces of the non-image portions is sufficiently large.

A process for preparing the above printing plates using a silver halide emulsion can be carried out simply and easily, securely and rapidly, can be automated and has characteristics such as high sensitivity, high resolution, and high image reproducibility. However, the difference between oleophilicity of the image portions and hydrophilicity of the non-image portions is not sufficiently great as compared with that of a printing plate (a PS plate) which has been realized from organic colloid such as a diazo light-sensitive material.

In order to remove such a drawback, it has been disclosed in British Patent No. 1,373,415 that before printing, a silver image is treated with a water-insoluble compound having a mercapto group or a thione ground to improve ink-receptivity. It has been considered that the mercapto group or thione group of said compound is adsorbed to image silver, and the image silver is covered with hydrophobic portions of said compound, whereby difference between the oleophilic property of image portions and the hydrophilic property of non-image portions is relatively enlarged.

In general, when a printing plate is prepared, a lithographic printing material utilizing the silver complex diffusion transfer process (DTR) in which image silver is made ink-receptive, is developed at high pH (pH 13 or more) after image exposure. Therefore, after development, it is necessary that the plate surface of a lithographic printing plate is neutralized and stabilized so that there has been used a neutralizing solution which is neutral to weakly acidic (pH 5 to 7).

After neutralization and stabilization, in order to impart oil sensitivity to silver image portions as described above, the lithographic printing plate is treated with an oil sensitivity-imparting solution containing a compound having a mercapto group or a thione group.

The compound having a mercapto group or a thione group is generally dissolved in an alkaline solution or an organic solvent, but it is not dissolved in a neutral to weakly acidic aqueous solution. Therefore, said compound is dissolved in an organic solvent and then added to an oil sensitivity-imparting solution.

On the other hand, in recent years, accompanied with enlargement of a lithographic printing plate utilizing image silver as ink-receptive characteristics, it is difficult to etch a lithographic printing plate with an oil sensitivity-imparting solution before printing the plate by a printer, and it has been attempted that an oil sensitivity-imparting function is also imparted to a neutralizing solution after development processing to omit use of the above oil sensitivity-imparting solution or increase in oil sensitivity-imparting power by using the oil sensitivity-imparting solution in combination.

However, use of an organic solvent such as ethyl alcohol and isopropyl alcohol, which has conventionally been used for dissolving the compound having a mercapto group or a thione group in the neutralizing solution having about pH 5 to 7 and the oil sensitivity-imparting solution, has problems in environment, safety and hygiene. Particularly in the neutralizing solution, the organic solvent is evaporated in a treatment apparatus so that there is a problem that the compound having a mercapto group or a thione group is precipitated easily.

In order to solve the above problem, a method of dissolving a compound having a mercapto group or a thione group in a plate surface-treating solution to be incorporated thereinto by using an amine compound has been disclosed in U.S. Pat. No. 5,525,455.

However, in a plate surface-treating solution in which a compound having a mercapto group or a thione group is dissolved by the above method, there is a new problem caused by low dissolution stability of the compound having a mercapto group or a thione group. That is, during storage of said treating solution, particularly when it is stored at low temperature in winter, there is a problem that the compound having a mercapto group or a thione group is precipitated. The resulting precipitates are not easily dissolved again even by raising temperature.

Also, when the compound having a mercapto group or a thione group is dissolved in a plate surface-treating solution substantially without using an organic solvent, there are problems that the oil sensitivity-imparting ability of the compound having a mercapto group or a thione group in said plate surface-treating solution is significantly lowered with the lapse of time, and ink-receptive characteristics are lowered by running processing.

SUMMARY OF THE INVENTION

An object of the present invention is to incorporate a compound having a mercapto group or a thione group stably into a neutralizing solution (a stabilizing solution) and an oil sensitivity-imparting solution which are plate surface-treating solutions of a lithographic printing plate utilizing image silver as ink-receptive characteristics, substantially without using an organic solvent, particularly to maintain high ink-receptive characteristics stably by preventing precipitation of a compound having a mercapto group or a thione group and retaining a dissolution state of said compound stably during storage at low temperature.

Another object of the present invention is to prevent deterioration of a plate surface-treating solution with the lapse of time and lowering of ink-receptive characteristics due to running processing.

Still another object of the present invention is to provide a plate surface-treating solution having excellent water retentivity at the time of starting of printing and excellent ink removability of a plate surface after printing.

The above objects of the present invention can be achieved by a process for treating a plate surface of a lithographic printing plate, which comprises, after exposing and developing a lithographic printing plate having a support and at least a silver halide emulsion layer and a physical development nuclei layer provided on the support, treating the lithographic printing plate with a plate surface-treating solution containing at least one water-insoluble compound having a mercapto group or a thione group and a compound represented by the following formula (1):

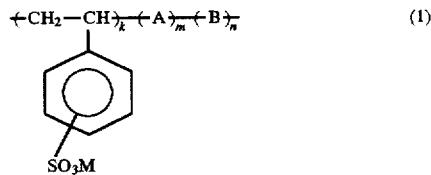

wherein A represents a vinyl monomer unit having a carboxyl group, B represents a copolymerizable ethylenic unsaturated monomer unit, M represents a cation such as hydrogen, an alkali metal and an ammonium ion, k represents 30 to 90 mole %, m represents 10 to 50 mole %, and n represents 0 to 50 mole %.

By incorporating the compound represented by the formula (1), the dissolution state of the compound having a mercapto group or a thione group in the plate surface-treating solution can be retained stably to heighten the stability of the plate surface-treating solution and impart stable ink-receptive characteristics to a lithographic printing plate, without impairing the ink-receptive characteristics of image portions.

DESCRIPTION OF THE PREFERRED EMBODIMENTS

In the following, the present invention is explained in detail.

The compound of the formula (1) to be used in the present invention is described below, but the compound of the formula (1) is not limited by the following description.

In the formula (1), as an example of a vinyl monomer constituting the vinyl monomer unit having a carboxyl group represented by A, there may be mentioned acrylic acid, methacrylic acid, sorbic acid, maleic acid, fumaric acid, itaconic acid and citraconic acid (an acid anhydride such as maleic anhydride and itaconic anhydride or a substituted compound thereof may be used). The above monomers may be in the form of a salt with an alkali metal atom or the like. Preferred is maleic anhydride.

As an example of a copolymerizable ethylenic unsaturated monomer constituting the copolymerizable ethylenic unsaturated monomer unit represented by B, there may be mentioned alkyl esters of acrylic acid or methacrylic acid such as methyl, ethyl, propyl, isopropyl, n-butyl and 2-ethylhexyl acrylates or methacrylates, a derivative of acrylic acid or methacrylic acid such as acrylonitrile, methacrylonitrile and acrylamide, and a N-vinyl compound such as N-vinylpyrrole, N-vinylcarbazole and N-vinylpyrrolidone, but it is preferred that the compound of the formula (1) to be used in the present invention does not contain the monomer of B.

The copolymer of the formula (1) may be a block copolymer or a random copolymer, but preferably a random copolymer.

As a preferred example of the compound represented by the formula (1), there may be mentioned a sulfonated compound of a copolymer of styrene and maleic anhydride, having a styrene/maleic anhydride ratio of 1/1 to 4/1 and a number average molecular weight of 20000 or less, preferably 1000 to 5000. Such a compound has been known and can be obtained as a commercially available product, for example, SSMA (trade name) produced by Elf Atochem North America Inc.

The content of the compound of the formula (1) is suitably in a concentration range of about 0.1% to 20% (by weight). The weight ratio of the compound of the formula (1) to the compound having a mercapto group or a thione group described below is preferably about 1 to 100 times.

The compound having a mercapto group or a thione group to be used in the present invention is described in, for example, British Patent No. 1,373,415, and it is particularly preferably a nitrogen-containing heterocyclic compound having an oleophilic group such as an alkyl group, an aryl group and an alkenyl group.

A representative example of the compound having a mercapto group or a thione group of the present invention is represented by the following formula (4):

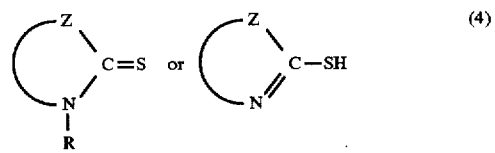

wherein R represents a hydrogen atom or an alkyl group, aryl group or alkenyl group having 12 or less carbon atoms, preferably 3 to 12 carbon atoms, and Z represents atomic groups necessary for forming a 5- or 6-membered heterocyclic ring together with N and C in the formula.

As a specific example of the 5- or 6-membered heterocyclic ring, there may be mentioned imidazole, imidazoline, thiazole, thiazoline, oxazole, oxazoline, pyrazoline, triazole, thiadiazole, oxadiazole, tetrazole, pyridine, pyrimidine, pyridazine, pyrazine and triazine. The above heterocyclic ring may be a ring produced by condensing two or more rings such as bicyclic, tricyclic, etc. or may be condensed with a benzene ring or a naphthalene ring. It is preferred that the 5- or 6-membered heterocyclic ring has a substituent such as an alkyl group, an aryl group or an alkenyl group, the total carbon number of the substituents being 3 to 12.

As a specific example of the compound having a mercapto group or a thione group, there may be mentioned 2-mercapto-4-phenylimidazole, 2-mercapto-1-benzylimidazole, 2-mercapto-benzimidazole, 1-ethyl-2-mercapto-benzimidazole, 2-mercapto-1-butyl-benzimidazole, 1,3-diethyl-benz-imidazoline-2-thione, 1,3-dibenzyl-imidazolidine-2-thione, 2,2'-dimercapto-1,1'- decamethylene-diimidazoline, 2-mercapto-4-phenylthiazole, 2-mercapto-benzothiazole, 2mercaptonaphthothiazole, 3-ethyl-benzothiazoline-2-thione, 3-dodecyl-benzothiazoline-2-thione, 2-mercapto-4, 5diphenyloxazole, 2-mercaptobenzoxazole, 3-pentyl-benzoxazoline-2-thione, 1-phenyl-3-methylpyrazoline-5-thione, 3-mercapto-4-allyl-5-pentadecyl-1,2,4-triazole, 3-mercapto-5-nonyl-1,2,4-triazole, 3-mercapto-4-acetamide-5-heptyl-1,2,4-triazole, 3-mercapto-4-amino-5-heptadecyl-1,2,4triazole, 2-mercapto-5-phenyl-1,3,4-thiadiazole, 2-mercapto-5-phenyl-1,3,4-thiadiazole, 2-mercapto-5-n-heptyloxathiazole, 2-mercapto-5-phenyl-1,3,4-oxadiazole, 2-mercapto-5-n-heptyl-1,3,4-oxadiazole, 5-mercapto-1-phenyl-tetrazole, 2-mercapto-5-nitropyridine, 1-methylquinoline-2(1H)-thione, 3-mercapto-4-methyl-6-phenyl-pyridazine, 2-mercapto-5,6-diphenyl-pyrazine, 2-mercapto-4,6-diphenyl-1,3,5-triazine, 2-amino-4-mercapto-6-benzyl-1,3,5-triazine and 1,5-dimercapto-3,7-diphenyl-S-triazolino [1,2-a]-S-triazoline, but the compound having a mercapto group or a thione group is not limited thereby.

The amount of the compound having a mercapto group or a thione group to be used in the present invention is in the range of 0.01 to 10 g, preferably 0.02 to 5 g per 1 liter of the plate surface-treating solution.

As a method for dissolving the compound having a mercapto group or a thione group to be used in the present invention in a neutral to weakly acidic (pH 5 to 7) plate surface-treating solution comprising water as a main component, there may be considered, for example, various methods such as a method of dissolving the compound in an alkaline solution and adjusting pH, a method of using an amine compound, and a method of using a quaternary ammonium salt type cationic surfactant, preferably a method of using an amine compound, but the method is not limited thereby. As described above, in the present invention, an organic solvent, particularly an organic solvent having low boiling point (100° C. or lower), for example, ethyl alcohol or isopropyl alcohol, is not substantially used. However, even when an organic solvent is used in such a range that a problem in safety is not caused (in such a range that an organic solvent is not regarded as a dangerous substance), for example, in an amount of 20% or less, particularly 10% or less based on the amount of the plate surface-treating solution, the effects of the present invention can be obtained.

As the above amine compound, there may be mentioned, for example, amino alcohols such as monoethanolamine, diethanolamine, triethanolamine and aminoethylethanolamine, monoamines such as propylamine and butylamine, diamines such as dimethylaminoethylamine, polyamines such as N-aminopropylpropanediamine and cyclic amines such as pyridine and piperidine, preferably amino alcohols. These amine compounds are available from Nihon Nyukazai Co., Koei Kagaku Kogyo Co., both Japan or the like.

The amine compound to be used in the present invention is added at a weight ratio to the compound having a mercapto group or a thione group of 1 to 100 times, preferably 1 to 50 times.

A preferred embodiment of the present invention is that the plate surface-treating solution further contains at least one compound selected from the group consisting of (a) a water-soluble polymer having a carboxyl group and a number average molecular weight of about 20000 or less; (b) an aromatic sulfonic acid formalin condensate; (c) an anionic surfactant having a polyoxyethylene group; and (d) an organic disulfide compound.

It has been disclosed in U.S. Pat. No. 5,118,583 that the compounds (a) to (d) described above prevent deterioration of oleophilizing ability of a compound having two or more mercapto groups in a treating solution. However, it was an unexpected finding that in a solution having pH 5 to 7, these compounds used in combination with the compound of the above formula (1) retain the dissolution state of the compound having a mercapto group or a thione group extremely stably and prevent precipitation under low temperature conditions almost completely.

The water-soluble polymer (a) having a carboxyl group (including a salt or anhydride thereof) and a number average molecular weight of about 20000 or less may be a homopolymer of an olefin type unsaturated compound having a carboxyl group as a monomer unit, for example, acrylic acid, methacrylic acid, maleic acid, sorbic acid and itaconic acid, or a copolymer of an olefin type unsaturated compound having a carboxyl group as a monomer unit and a vinyl type monomer which is copolymerizable therewith.

As the vinyl type monomer for obtaining the copolymer, there may be mentioned styrene, a styrene derivative such as an alkyl (e.g., methyl, ethyl or the like)-substituted styrene, an alkoxy (e.g., methoxy or the like)-substituted styrene and a halogen (e.g., chlorine or the like)-substituted styrene, ethylenic unsaturated monoolefins such as ethylene and butylene, vinyl halides such as vinyl chloride, vinyl esters such as vinyl acetate, alkyl esters of acrylic acid or methacrylic acid such as methyl and isobutyl acrylates or methacrylates, vinyl ether and vinyl naphthalenes. The vinyl type monomer may contain a different kind of an olefin type unsaturated compound having a carboxyl group as a copolymer component, particularly preferably contains an oleophilic vinyl monomer such as styrene as a copolymer component.

The ratio of the olefin type unsaturated compound having a carboxyl group in the copolymer is about 10% by weight or more, preferably 20% by weight or less. The carboxyl group may be in the form of a salt such as sodium and potassium, or may be in the form of an acid anhydride.

The above water-soluble polymers having a carboxyl group have a number average molecular weight of about 20000 or less, particularly preferably in the range of about 1000 to 15000.

These water-soluble polymers can be prepared easily by a known preparation process such as solution polymerization and can be also obtained as commercially available products.

The content of the water-soluble polymer in the plate surface-treating solution is suitably in a concentration range of about 0.1% to 20% (by weight). The weight ratio of the water-soluble polymer to the compound having a mercapto group or a thione group is preferably about 1 to 100 times.

Specific examples of the water-soluble polymer are shown by the following formulae (5) to (8). A polymerization ratio of the copolymer is shown by % by weight.

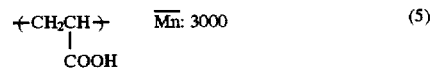

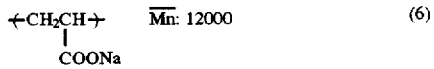

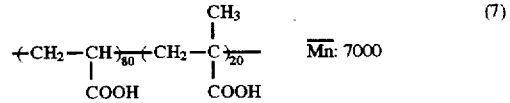

-continued

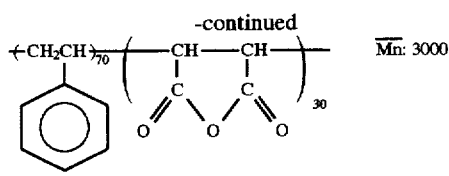

As a representative example of the above aromatic sulfonic acid-formalin condensate (b), there may be mentioned a sodium β-naphthalenesulfonate-formalin condensate and a sodium methylnaphthalenesulfonate-formalin condensate which are included in the following formula (9):

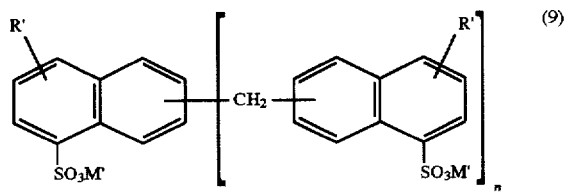

wherein n represents an integer of 1 or more, preferably 2 to 5, R' represents an alkyl group preferably having 1 to 6 carbon atoms, and M' represents a cation such as a hydrogen atom and an alkali metal atom.

These compounds are commercially available from various manufacturers and can be obtained easily. These compounds used as an active agent may be used in combination of two or more of them.

The content of the condensate used as an active agent is suitably in a concentration range of about 0.1% to 20% (by weight). The weight ratio of the condensate to the compound having a mercapto group or a thione group is preferably about 1 to 100 times.

The above anionic surfactant (c) having a polyoxyethylene group is represented by the following formula (10):

$$R''-Q+CH_2CH_2O)_n+B)_m-A \quad (10)$$

wherein R" represents a substituted or unsubstituted alkyl group or alkenyl group each having 1 to 30 carbon atoms, or a substituted or unsubstituted aryl group;

Q represents O, S, COO, —N(R$_1$)—, —N(R$_1$)CO— or —N(R$_1$)SO$_2$— where R$_1$ represents a hydrogen atom or a substituted or unsubstituted alkyl group;

B represents a divalent group such as an alkylene group, an arylene group and an oxypropylene group;

m represents 0 or an integer of 1 or more;

n represents the average polymerization degree of ethylene oxide and is 1 to 50, preferably 2 to 10; and A represents

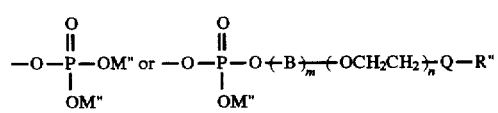

wherein M" represents a cation such as a hydrogen atom, an alkali metal, an alkaline earth metal, ammonium and a lower alkylamine, and B, Q, R", m and n are defined as described above.

These compounds are described in U.S. Pat. Nos. 3,026,202 and No. 2,600,831, Japanese Provisional Patent Publication No. 98235/1979 and Japanese Patent Publication No. 23747/1965.

Specific examples of the anionic surfactant having a polyoxyethylene group of the present invention are shown by the following formulae (11) to (15). CH$_2$CH$_2$O is abbreviated to EO.

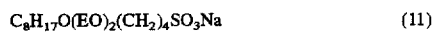

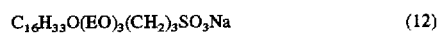

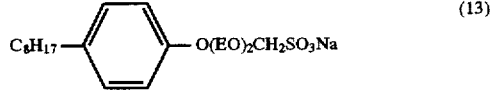

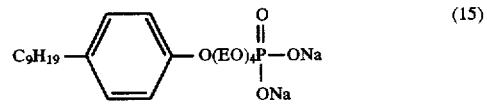

These anionic surfactants having a polyoxyethylene group can be easily obtained as an anionic surfactant from various manufacturers.

The content of the anionic surfactant is suitably about 0.1% to 20% (by weight). The weight ratio of the anionic surfactant to the compound having a mercapto group or a thione group is preferably about 1 to 100 times.

Representative examples of the above organic disulfide compound (d) are shown by the following formulae (16) to (18).

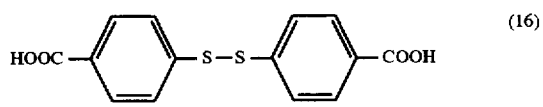

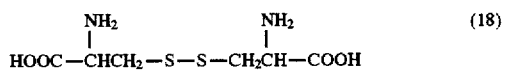

The content of the organic disulfide compound is suitably about 0.1% to 20% (by weight). The weight ratio of the organic disulfide compound to the compound having a mercapto group or a thione group is preferably about 1/10 to 10 times.

In the present invention, by further incorporating a bisulfite into the plate surface-treating solution, lowering of the oleophilizing ability with the lapse of time of the compound having a mercapto group or a thione group can be prevented to heighten the stability of the properties of the plate surface-treating solution and impart stable ink-receptive characteristics to a lithographic printing plate.

The bisulfite to be used in the present invention may be used in the form of an alkali metal salt such as sodium and potassium or an ammonium salt, but the bisulfite is not limited thereby. The content of the bisulfite is 1 to 100 g/liter, preferably 2 to 30 g/liter.

Further, in order to improve running processing suitability, it is preferred that a phosphoric acid or a phosphate is contained in the plate surface-treating solution. By combining the bisulfite with the phosphoric acid or phosphate, even when running processing is carried out, stable ink-receptive characteristics can be retained.

Further, by using the phosphoric acid or phosphate in combination with the amine compound described above, a plate surface-treating solution having excellent rust prevention property can be obtained.

The phosphoric acid or phosphate to be used in the present invention may be in the form of orthophosphoric acid, metaphosphoric acid, polyphosphoric acid, pyrophosphoric acid, or a salt thereof, but the phosphoric acid or phosphate is not limited thereby. The content of the phosphoric acid or phosphate is in the range of 0.05 mole/liter or more, preferably 0.1 to 1.0 mole/liter.

As described above, the plate surface-treating solution of the present invention has a role of improving the ink-receptive characteristics of silver image portions. On the other hand, it is also important to improve the hydrophilic property of non-image portions to give a function that the non-image portions receives damping water easily at the time of printing. In this respect, when the plate surface-treating solution of the present invention is used in combination of at least one compound selected from the group consisting of compounds represented by the following formula (2) and formula (3) and hexylene glycol, with inorganic fine particles having an average particle size of 0.1 μm or less, water retentivity in an initial stage is improved remarkably.

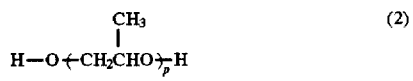

(2)

wherein p represents an integer of 1 or more,

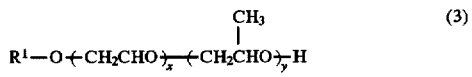

(3)

wherein $R^1$ represents a hydrogen atom or an alkyl group having 1 to 9 carbon atoms, x and y each represents a mole number which is necessary for making the number average molecular weight of the compound of the formula (3) 250 or more, and x/y is 0.5 to 2.

Thus, it is preferred to use the plate surface-treating solution (the oil sensitivity-imparting solution) to which a function of retaining water is imparted as a starter solution at the time of starting of printing. Further, the compounds of the formulae (2) and (3) and hexylene glycol also serve as a plate cleaner for removing ink attached to a printing plate.

As a specific example of the compound of the formula (2), there may be mentioned propylene glycol, dipropylene glycol and tripropylene glycol, and n is preferably 1 to 3, but the compound of the formula (2) is not limited thereby.

The compound of the formula (3) is a compound having a propylene oxide group unit and an ethylene oxide group unit and is a compound preferably having an alkyl group with 1 to 9 carbons, more preferably having an alkyl group with 4 to 9 carbon atoms at an end thereof. The molecular weight of the compound of the formula (3) is 250 or more, preferably 500 to 2000. The upper limit of the molecular weight is generally 5000, but it may exceed 5000. Further, random polymerization is preferred. The compound of the formula (3) has been known and can be obtained as a commercially available product, for example, Unilube 50MB series (trade name) from Nippon Oil & Fats Co., Japan.

In consideration of an environmental problem or the like, the content of the compounds of the formulae (2) and (3) and hexylene glycol to be used in the present invention is 1 to 100 g, preferably 5 to 50 g per 1 liter of the plate surface-treating solution.

The inorganic fine particles having an average particle size of 0.1 μm or less to be used in the present invention are colloidal silica, colloidal alumina or the like, preferably colloidal silica having an average particle size of 0.003 to 0.05 μm. The content of the inorganic fine particles is 1 to 20 g, preferably 3 to 10 g per 1 liter of the plate surface-treating solution.

The plate surface-treating solution of the present invention may be mixed with, in addition to the above compounds, a buffer, a preservative, a wetting agent and a surfactant. Further, a complexing agent such as iminodiacetic acid and ethylenediaminetetraacetic acid may be mixed.

The lithographic printing plate utilizing the silver complex diffusion transfer process which is the target of the present invention may have an undercoat layer which also serves as a halation-preventing layer, a silver halide emulsion layer and a physical development nuclei layer provided on a support as described above, or may have a silver halide emulsion layer on physical development nuclei carried on an aluminum support as described in U.S. Pat. No. 5,427,889 and Japanese Provisional Patent Publications No. 216236/1993 and No. 81194/1994.

The silver halide emulsion may be either an emulsion containing silver chloride, silver bromide or silver chlorobromide, or an emulsion containing the above emulsion and an iodide. A binder of the silver halide emulsion is preferably gelatin, but partial or whole gelatin may be substituted by other colloidal substance, for example, casein, albumin or a cellulose derivative. In general, silver halide may be used in an amount of 0.5 to 7 $g/m^2$ calculated on silver nitrate, and the binder may be used in an amount of 0.5 to 10 $g/m^2$.

The silver halide emulsion can be prepared by a common method which has been known in the field of photography, and particularly, a process for preparing the silver halide emulsion to be used for a printing plate has been also disclosed in the above-mentioned patent publications.

As a support, there may be used paper, various films, plastics, paper coated with a resinous material and a metal such as an aluminum plate.

With respect to physical development nuclei to be used in the physical development nuclei layer, examples of this kind of chemicals have been known, and there may be used metals such as antimony, bismuth, cadmium, cobalt, palladium, nickel, silver, lead and zinc, and sulfides thereof. In the physical development nuclei layer, a developer may be also contained, and a water-soluble binder may be contained.

The lithographic printing plate to be used in the present invention is treated generally with an alkaline developing solution after image exposure. As such a developing solution, there may be used any developing solution such as a common photographic developing solution containing a developing agent such as hydroquinone, a developing solution containing sodium thiosulfate or the like of the silver complex diffusion transfer process or a highly alkaline developing solution obtained by making the above developing solution an activator.

EXAMPLES

In the following, the present invention is described in detail by referring to Examples, but the present invention is not limited thereby as a matter of course.

Example 1

On one surface of each polyester film support subjected to a subbing treatment, a matting layer containing silica particles having an average particle size of 5 μm was provided, and on the other surface of the support, a halation-preventing undercoat layer (adjusted to pH 4) containing carbon black in such an amount that light reflectance was 3% and silica powder having an average particle size of 7 μm in an amount of 20% by weight based on the amount of photographic gelatin, and a high sensitivity silver chloride emulsion layer (adjusted to pH 4) containing silica powder having an average particle size of 7 μm in an amount of 5% by weight based on the amount of photographic gelatin, which was chemically sensitized and then spectrally sensitized to a green-sensitive region were provided.

The gelatin of the undercoat layer was coated in an amount of 3.5 g/m², the gelatin of the emulsion layer was coated in an amount of 0.8 g/m², and the silver halide of the emulsion layer was coated in an amount calculated on silver nitrate of 1.0 g/m². In the undercoat layer and the emulsion layer, formalin was contained in an amount of 5.0 mg/1 g of gelatin. After drying, the supports were heated at 40° C. for 14 days, and then a nucleus-coating solution described in Plate No. 31 of Example 2 of Japanese Provisional Patent Publication No. 103104/1979 was coated on the respective emulsion layers, followed by drying, to prepare lithographic printing plates. The silver halide emulsion was obtained by adding $4 \times 10^{-6}$ mole of rhodium chloride per 1 mole of silver halide at the time of physical aging and had an average particle size of 0.4 μm.

The raw plates of the lithographic printing plates thus obtained were subjected to image wise exposure by a process camera having an image-reversing mechanism and then subjected to development processing at 30° C. for 30 seconds by using a developing solution (a solution used) shown below.

| <Developing solution> | |
|---|---|
| Sodium hydroxide | 24 g |
| Potassium hydroxide | 8 g |
| Anhydrous sodium sulfite | 50 g |
| 2-Methyl-2-amino-1-propanol | 30 g |
| 2-Mercapto-5-n-heptyl-oxadiazole | 0.2 g |
| Made up to 1 liter with addition of water. | |

After the above development processing, the printing plates were treated at ordinary temperature for 20 seconds by using fresh solutions of neutralizing solutions (stabilizing solutions) shown below, respectively. Further, the neutralizing solutions shown below were charged into polyethylene containers, respectively, a test with the lapse of time was carried out at 5° C. for 1 month, and the same treatment was carried out. Then, a printing test was carried out, and it was examined whether or not each mercapto compound in the neutralizing solutions was precipitated.

| <Neutralizing solution> | |
|---|---|
| Phosphoric acid | 1.2 g |
| Sodium primary phosphate | 25 g |
| Ethylene glycol | 5 g |
| Compound having a mercapto group or a thione group | 0.2 g |
| Diethanolamine | 5 g |
| Compound of the formula (1) | Amount shown in Table 1 |
| Made up to 1 liter with addition of water. (Adjusted to pH 6) | |

The above compound of the formula (1) was a sulfonated compound of a random copolymer of styrene and maleic anhydride (polymerization ratio of styrene/maleic anhydride: 3/1, number average molecular weight: 3000).

The combination of compounds having a mercapto group or a thione group and the compound of the formula (1) is shown in Table 1.

TABLE 1

| Treating solution (Neutralizing solution) | Compound having a mercapto group or a thione group | Compound of the formula (1) | Remarks |
|---|---|---|---|
| 1 | None | None | Comparison |
| 2 | Compound C | None | Comparison |
| 3 | Compound C | 0.2 g | Present invention |
| 4 | Compound D | None | Comparison |
| 5 | Compound D | 0.2 g | Present invention |
| 6 | Compound E | None | Comparison |
| 7 | Compound E | 0.2 g | Present invention |

In Table 1, Compound C is 2-mercapto-5-n-heptyl-oxadiazole, Compound D is 3-pentyl-benzoxazoline-2-thione, and Compound E is 3-mercapto-5-nonyl-1,2,4-triazole.

The printing plates prepared by the above operation were set in an offset printing press (AM1250, trade name, manufactured by Addressograph.Multigraph Co., Japan). AB-Dick 3-1012 Black ink (trade name, produced by AB-Dick Co.) was used as an ink, OD30 (trade name, damping water produced by Mitsubishi Paper Mills, Limited., Japan) was used as damping water, etching was carried out by using tap water, the printing plates were printed, and ink-receptive characteristics were evaluated.

Ink-receptive characteristics were evaluated by the number of printing papers until a print having good image density without unevenness of density was obtained after feeding of papers was started simultaneously with touching the ink to the plate surface. The results of printing and the results of the test with the lapse of time of the neutralizing solutions are shown in Table 2.

TABLE 2

| Treating solution (Neutralizing solution) | Ink-receptive characteristics | | Test with the lapse of time 1 month at 5° C. |
|---|---|---|---|
| | Fresh | Lapse of 1 month at 5° C. | |
| 1 | 80 | 85 | Not precipitated |
| 2 | 12 | 120 | Precipitated |
| 3 | 8 | 10 | Not precipitated |
| 4 | 10 | 100 | Precipitated |
| 5 | 11 | 12 | Not precipitated |
| 6 | 9 | 96 | Precipitated |
| 7 | 8 | 10 | Not precipitated |

Even when the neutralizing solutions (the plate surface-treating solutions) of the present invention were stored at low temperature, the compounds having a mercapto group or a thione group were not precipitated, and stable ink-receptive characteristics were obtained.

Example 2

Neutralizing solutions shown below were prepared, and a test with the lapse of time was carried out at 5° C. for a long period of time of 5 months. In the same manner as in Example 1, printing plates were treated with fresh solutions and treating solutions after the lapse of time, respectively, and the same tests were carried out.

<Neutralizing solution>

| | |
|---|---|
| Phosphoric acid | 1.2 g |
| Sodium primary phosphate | 25 g |
| Ethylene glycol | 5 g |
| Compound having a mercapto group or a thione group | 0.2 g |
| Diethanolamine | 5 g |
| Compound of the formula (1) | Amount shown in Table 3 |
| Compound G | 0.2 g |
| Made up to 1 liter with addition of water. (Adjusted to pH 6) | |

The compound of the formula (1) was a sulfonated compound of a random copolymer of styrene and maleic anhydride (polymerization ratio of styrene/maleic anhydride: 3/1, number average molecular weight: 3000). The compound having a mercapto group or a thione group was 2-mercapto-5-n-heptyl-oxadiazole.

The combination of the compound of the formula (1) and Compound G in the neutralizing solutions is shown in Table 3, and the test results are shown in Table 4.

TABLE 3

| Treating solution (Neutralizing solution) | Compound of the formula (1) | Compound G | Remarks |
|---|---|---|---|
| 8 | None | None | Comparison |
| 9 | 0.2 g | None | Present invention |
| 10 | None | Compound of the formula (6) | Comparison |
| 11 | 0.2 g | Compound of the formula (6) | Present invention |
| 12 | None | Compound of the formula (8) | Comparison |
| 13 | 0.2 g | Compound of the formula (8) | Present invention |
| 14 | None | Surfactant H | Comparison |
| 15 | 0.2 g | Surfactant H | Present invention |
| 16 | None | Compound of the formula (12) | Comparison |
| 17 | 0.2 g | Compound of the formula (12) | Present invention |
| 18 | None | Compound of the formula (16) | Comparison |
| 19 | 0.2 g | Compound of the formula (16) | Present invention |

In Table 3, Surfactant H is a sodium β-naphthalenesulfonate-formalin condensate.

TABLE 4

| Treating solution (Neutralizing solution) | Ink-receptive characteristics | | Test with the lapse of time 5 months at 5° C. |
|---|---|---|---|
| | Fresh | Lapse of 5 month at 5° C. | |
| 8 | 12 | 120 | Precipitated |
| 9 | 10 | 40 | Slightly precipitated |
| 10 | 9 | 75 | Precipitated |
| 11 | 10 | 10 | Not precipitated |
| 12 | 10 | 80 | Precipitated |
| 13 | 12 | 13 | Not precipitated |
| 14 | 10 | 70 | Precipitated |
| 15 | 9 | 12 | Not precipitated |
| 16 | 8 | 80 | Precipitated |
| 17 | 9 | 10 | Not precipitated |
| 18 | 11 | 76 | Precipitated |
| 19 | 9 | 10 | Not precipitated |

From the above results, it can be seen that by using the compound of the formula (1) (a sulfonated compound of a copolymer of styrene and maleic anhydride) in combination with Compound G, i.e., a water-soluble polymer having a carboxyl group and a number average molecular weight of about 20000 or less, an aromatic sulfonic acid formalin condensate, an anionic surfactant having a polyoxyethylene group or an organic disulfide compound, even under more severe conditions, precipitation of the compound having a mercapto group or a thione group could be prevented, and high ink-receptive characteristics could be maintained stably.

Example 3

After development by using the developing solution of Example 1, treatment was carried out by using neutralizing solutions shown below to prepare printing plates.

<Neutralizing Solution>

| | |
|---|---|
| Phosphoric acid | 1.2 g |
| Sodium primary phosphate | 25 g |
| Ethylene glycol | 5 g |
| Made up to 1 liter with addition of water. (Adjusted to pH 6) | |

The printing plates prepared as described above were etched with oil sensitivity-imparting solutions shown below, respectively, and the same printing test as in Example 1 was carried out. Also, a test with the lapse of time of the oil sensitivity-imparting solutions was carried out in the same manner as in Example 1. The printing plates were etched with the solutions after the lapse of time, respectively, and the same printing test was carried out.

<Oil sensitivity-imparting solution>

| | |
|---|---|
| Monosodium phosphate | 15 g |
| Colloidal silica (a 20% solution, average particle size: 15 nm) | 10 g |
| Compound having a mercapto group or a thione group | 0.5 g |
| Diethanolamine | 10 g |
| Compound of the formula (1) | Amount shown in Table 5 |
| Made up to 1 liter with addition of water. (Adjusted to pH 6) | |

The compound of the formula (1) was a sulfonated compound of a random copolymer of styrene and maleic anhydride (polymerization ratio of styrene/maleic anhydride: 3/1, molecular weight: 3000).

The combination of compounds having a mercapto group or a thione group and the compound of the formula (1) is shown in Table 5.

TABLE 5

| Treating solution (oil sensitivity-imparting solution) | Compound having a mercapto group or a thione group | Compound of the formula (1) | Remarks |
|---|---|---|---|
| 20 | None | None | Comparison |
| 21 | Compound C | None | Comparison |
| 22 | Compound C | 0.5 g | Present invention |
| 23 | Compound D | None | Comparison |
| 24 | Compound D | 0.5 g | Present invention |
| 25 | Compound E | None | Comparison |
| 26 | Compound E | 0.5 g | Present invention |

Compounds C, D and E in Table 1 are as described in Example 1.

The results of printing and the results of a test with the lapse of time are shown in Table 6.

TABLE 6

| Treating solution (oil sensi-tivity-imparting solution) | Ink-receptive characteristics Fresh | Ink-receptive characteristics Lapse of 1 month at 5° C. | Test with the lapse of time 1 month at 5° C. |
|---|---|---|---|
| 20 | 80 | 100 | Not precipitated |
| 21 | 11 | 88 | Precipitated |
| 22 | 9 | 10 | Not precipitated |
| 23 | 10 | 110 | Precipitated |
| 24 | 10 | 12 | Not precipitated |
| 25 | 8 | 107 | Precipitated |
| 26 | 9 | 11 | Not precipitated |

Even when the oil sensitivity-imparting solutions (the plate surface-treating solutions) of the present invention were stored at low temperature, the compounds having a mercapto group or a thione group were not precipitated, and stable ink-receptive characteristics were obtained.

Example 4

Oil sensitivity-imparting solutions shown below were prepared, and a test with the lapse of time was carried out at 5° C. for a long period of time of 5 months. The same treatment as in Example 3 was carried out, and the same test was carried out. The combination of the compound of the formula (1) and Compound G is shown in Table 7, and the test results are shown in Table 8.

| <Oil sensitivity-imparting solution> | |
|---|---|
| Monosodium phosphate | 15 g |
| Colloidal silica (a 20% solution, average particle size: 15 nm) | 10 g |
| Compound having a mercapto group or a thione group | 0.5 g |
| Diethanolamine | 10 g |
| Compound of the formula (1) | Amount shown in Table 7 |
| Compound G | 0.3 g |
| Made up to 1 liter with addition of water. (Adjusted to pH 6) | |

The compound of the formula (1) was a sulfonated compound of a random copolymer of styrene and maleic anhydride (polymerization ratio of styrene/maleic anhydride: 3/1, molecular weight: 3000), and the compound having a mercapto group or a thione group was 2-mercapto-5-n-heptyl-oxadiazole.

TABLE 7

| Treating solution (oil sensitivity-imparting solution) | Compound of the formula (1) | Compound G | Remarks |
|---|---|---|---|
| 27 | None | None | Comparison |
| 28 | 0.5 g | None | Present invention |
| 29 | None | Compound of the formula (5) | Comparison |
| 30 | 0.5 g | Compound of the formula (5) | Present invention |
| 31 | None | Compound of the formula (7) | Comparison |
| 32 | 0.5 g | Compound of the formula (7) | Present invention |
| 33 | None | Surfactant H | Comparison |
| 34 | 0.5 g | Surfactant H | Present invention |
| 35 | None | Compound of the formula (11) | Comparison |
| 36 | 0.5 g | Compound of the formula (11) | Present invention |
| 37 | None | Compound of the formula (16) | Comparison |
| 38 | 0.5 g | Compound of the formula (16) | Present invention |

In Table 7, Surfactant H is a sodium β-naphthalenesulfonate-formalin condensate.

TABLE 8

| Treating solution (oil sensi-tivity-imparting solution) | Ink-receptive characteristics Fresh | Ink-receptive characteristics Lapse of 5 month at 5° C. | Test with the lapse of time 5 months at 5° C. |
|---|---|---|---|
| 27 | 13 | 150 | Precipitated |
| 28 | 11 | 30 | Slightly precipitated |
| 29 | 9 | 90 | Precipitated |
| 30 | 11 | 11 | Not precipitated |
| 31 | 10 | 85 | Precipitated |
| 32 | 9 | 11 | Not precipitated |
| 33 | 10 | 86 | Precipitated |
| 34 | 8 | 10 | Not precipitated |
| 35 | 10 | 70 | Precipitated |
| 36 | 8 | 11 | Not precipitated |
| 37 | 10 | 83 | Precipitated |
| 38 | 9 | 12 | Not precipitated |

From the above results, it can be seen that by using the compound of the formula (1) (a sulfonated compound of a copolymer of styrene and maleic anhydride) in combination with Compound G, i.e., a water-soluble polymer having a carboxyl group and a number average molecular weight of about 20000 or less, an aromatic sulfonic acid formalin condensate, an anionic surfactant having a polyoxyethylene group or an organic disulfide compound, even under more severe conditions, precipitation of the compound having a mercapto group or a thione group could be prevented, and high ink-receptive characteristics could be maintained stably.

Example 5

| <Neutralizing solution> | |
| --- | --- |
| Sodium primary phosphate | 25 g |
| 2-Mercapto-5-n-heptyl-oxadiazole | 0.2 g |
| Diethanolamine | 5 g |
| Compound of the formula (1) | 0.2 g |
| Made up to 1 liter with addition of water. | |
| (Adjusted to pH 6) | |

The compound of the formula (1) was a sulfonated compound of a random copolymer of styrene and maleic anhydride (polymerization ratio of styrene/maleic anhydride: 3/1, molecular weight: 3000).

A neutralizing solution was prepared by adding 2.5 g of sodium bisulfite to the above neutralizing solution.

By using a fresh solution of this neutralizing solution and a neutralizing solution after the lapse of 1 month at 50° C. in a polyethylene container, treatment was carried out in the same manner as in Example 1.

The ink-receptive characteristics of two kinds of printing plates obtained were evaluated in the same manner as in Example 1. As a result, the number of printing papers in the case of using the fresh neutralizing solution was 8, and the number of printing papers in the case of using the neutralizing solution heated at 50° C. for 1 month was 10. Thus, it can be seen that by incorporating a bisulfite into the plate surface-treating solution (the neutralizing solution), even when the solution is stored at a high temperature of 50° C., ink-receptive characteristics are scarcely lowered, and high ink-receptive characteristics can be retained.

Example 6

A test was carried out in the same manner as in Example 5 except for changing the mercapto compound of Example 5 to the following compounds:

3-pentyl-benzoxazoline-2-thione;

3-mercapto-5-nonyl-1,2,4-triazole;

2-mercapto-benzothiazole; and 2-mercapto-4,6-diphenyl-1,3,5-triazine.

The results are similar to those of Example 5.

Example 7

By using the neutralizing solution of Example 5, running processing of 8 m² per 1 liter of the neutralizing solution was carried out. The ink-receptive characteristics of a printing plate treated before starting the running processing and a printing plate treated after the running processing were evaluated in accordance with Example 1. As a result, the number of printing papers in the case of the neutralizing solution before the running processing was 10, and the number of printing papers in the case of the neutralizing solution after the running processing was 15. Thus, it can be seen that by using a bisulfite and a primary phosphate, high ink-receptive characteristics can be obtained even after running processing.

Example 8

After development by using the developing solution of Example 1, treatment was carried out by using a neutralizing solution shown below to prepare printing plates.

| <Neutralizing solution> | |
| --- | --- |
| Phosphoric acid | 1.2 g |
| Potassium primary phosphate | 25 g |
| Diethanolamine | 5 g |
| Made up to 1 liter with addition of water. | |
| (Adjusted to pH 6) | |

The printing plate prepared as described above was etched with an oil sensitivity-imparting solution (fresh) shown below, and the same printing test as in Example 1 was carried out. The oil sensitivity-imparting solution was charged into a polyethylene container, and a test with the lapse of time at 50° C. for 1 month was carried out. Thereafter, the printing plate was etched with this oil sensitivity-imparting solution, and a test of ink-receptive characteristics was carried out.

As a result, the number of printing papers in the case of the fresh oil sensitivity-imparting solution was 8, and the number of printing papers in the case of the oil sensitivity-imparting solution heated at 50° C. for 1 month was 10. Thus, it can be seen that by incorporating a bisulfite into the plate surface-treating solution (the oil sensitivity-imparting solution), even when the solution is stored at a high temperature of 50° C., ink-receptive characteristics are scarcely lowered, and high ink-receptive characteristics can be retained.

| <Oil sensitivity-imparting solution> | |
| --- | --- |
| Monosodium phosphate | 15 g |
| Sodium bisulfite | 2.5 g |
| Colloidal silica (a 20% solution, average particle size: 15 nm) | 10 g |
| 2-Mercapto-5-n-heptyl-oxadiazole | 0.5 g |
| Diethanolamine | 10 g |
| Compound of the formula (1) | 0.5 g |
| Made up to 1 liter with addition of water. | |
| (Adjusted to pH 6) | |

The compound of the formula (1) was a sulfonated compound of a copolymer of styrene and maleic anhydride (polymerization ratio of styrene/maleic anhydride: 3/1, molecular weight: 3000).

Example 9

A test was carried out in the same manner as in Example 8 except for changing the mercapto compound of Example 8 to the following compounds:

3-pentyl-benzoxazoline-2-thione;

3-mercapto-5-nonyl-1,2,4-triazole;

2-mercapto-benzothiazole; and 2-mercapto-4,6-diphenyl-1,3,5-triazine.

The results are similar to those of Example 8.

Example 10

After lithographic printing plates were exposed and developed in accordance with Example 1, the plates were treated with a neutralizing solution shown below.

| <Neutralizing solution> | |
|---|---|
| Phosphoric acid | 1.2 g |
| Sodium primary phosphate | 25 g |
| Anhydrous sodium sulfite | 2.5 g |
| Ethylene glycol | 5 g |
| Made up to 1 liter with addition of water. (Adjusted to pH 6) | |

The printing plates prepared by the above operation were set in an offset press (AM1250, trade name, manufactured by Addressograph.Multigraph Co.) and etched with oil sensitivity-imparting solutions shown below, respectively, and water retentivity and ink removability were evaluated. A test of water retentivity was carried out by using OD30 (trade name, produced by Mitsubishi Paper Mills, Limited.) as damping water and VANSON2329 (trade name, produced by Vanson Hollad Ink Corp.) as ink.

Water retentivity was evaluated by the degree of toning of prints when 500 sheets were printed.

Ink removability was evaluated by whether or not ink could be removed when the plate surfaces of the lithographic printing plates to which ink was attached were rubbed 5 times with absorbent cotton impregnated with the oil sensitivity-imparting solution.

| <Oil sensitivity-imparting solution> | |
|---|---|
| Citric acid | 15 g |
| Colloidal silica (a 20% aqueous solution; average particle size: 15 nm) | 10 g |
| Compound K | 20 g |
| Diethanolamine | 10 g |
| 2-Mercapto-5-n-heptyl-oxadiazole | 1 g |
| Compound of the formula (1) | 0.5 g |
| Made up to 1 liter with addition of water. (Adjusted to pH 6) | |

The compound of the formula (1) was a sulfonated compound of a random copolymer of styrene and maleic anhydride (polymerization ratio of styrene/maleic anhydride: 3/1, molecular weight: 3000).

As Compound K, dipropylene glycol, hexylene glycol, a compound represented by the following formula (19) or a compound represented by the following formula (20) was added.

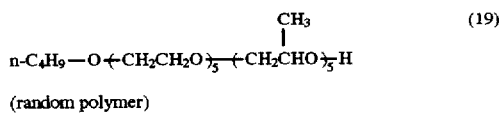

(random polymer)

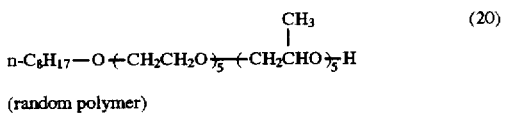

(random polymer)

As a result of the water retentivity test, by using the oil sensitivity-imparting solution in combination with dipropylene glycol (the compound of the formula (2)), the compound of the formula (19) or (20) (which is a compound of the formula (3)) or hexylene glycol and colloidal silica, water retentivity at the time of starting printing was improved remarkably, and no toning was caused. As a result of the ink removability test, ink was removed completely by either of the oil sensitivity-imparting solutions.

Example 11

Oil sensitivity-imparting solutions shown below were prepared, and iron nails were dipped in the solutions, respectively, and left to stand for 3 days to examine a state of generating rust.

| <Oil sensitivity-imparting solution> | |
|---|---|
| Acid | 5 g |
| Colloidal silica (a 20% aqueous solution, average particle size: 15 nm) | 10 g |
| Dipropylene glycol | 20 g |
| Amine compound | 10 g |
| 2-Mercapto-5-n-heptyl-oxadiazole | 1 g |
| Compound of the formula (1) | 0.5 g |
| Made up to 1 liter with addition of water. (Adjusted to pH 6) | |

The compound of the formula (1) was a sulfonated compound of a random copolymer of styrene and maleic anhydride (polymerization ratio of styrene/maleic anhydride: 3/1, molecular weight: 3000).

The combination of acids and amine compounds is shown in Table 9, and the results of a rust test are shown in Table 10.

TABLE 9

| Treating solution (oil sensitivity-imparting solution) | Acid | Amine compound |
|---|---|---|
| 39 | Citric acid | Monoethanolamine |
| 40 | Citric acid | Propylamine |
| 41 | Succinic acid | Monoethanolamine |
| 42 | Phosphoric acid | Monoethanolamine |
| 43 | Phosphoric acid | Propylamine |
| 44 | Monosodium phosphate | Monoethanolamine |
| 45 | Monosodium phosphate | Propylamine |

TABLE 10

| Treating solution (oil sensitivity-imparting solution) | Generation of rust |
|---|---|
| 39 | Generated |
| 40 | Generated |
| 41 | Generated |
| 42 | Not generated |
| 43 | Not generated |
| 44 | Not generated |
| 45 | Not generated |

From the above results, it can be seen that generation of rust is prevented by using a phosphate and an amine compound in combination.

We claim:

1. A process for treating a plate surface of a lithographic printing plate, which comprises, after exposing and developing a lithographic printing plate having a support and at least a silver halide emulsion layer and a physical development nuclei layer provided on the support, treating the plate surface of the lithographic printing plate with a plate surface-treating solution containing at least one water-insoluble compound having a mercapto group or a thione group and a compound represented by the following formula (1):

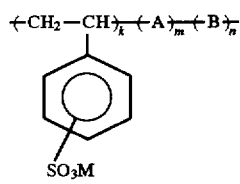

(1)

wherein A represents a vinyl monomer unit having a carboxyl group, B represents a copolymerizable ethylenic unsaturated monomer unit, M represents a cation, k represents 30 to 90 mole %, m represents 10 to 50 mole %, and n represents 0 to 50 mole %.

2. The process according to claim 1, wherein the plate surface-treating solution contains an amine compound.

3. The process according to claim 1, wherein the plate surface-treating solution contains at least one compound selected from the group consisting of the following compounds (a) to (d):

(a) a water-soluble polymer having a carboxyl group and a number average molecular weight of 20000 or less;

(b) an aromatic sulfonic acid-formalin condensate;

(c) an anionic surfactant having a polyoxyethylene group; and (d) an organic disulfide compound.

4. The process according to claim 1, wherein the plate surface-treating solution contains a bisulfite.

5. The process according to claim 4, wherein the plate surface-treating solution contains a phosphoric acid or a phosphate.

6. The process according to claim 1, wherein the plate surface-treating solution contains at least one compound selected from the group consisting of compounds represented by the following formula (2) and formula (3) and hexylene glycol, and inorganic fine particles having an average particle size of 0.1 μm or less.

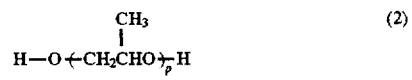

(2)

wherein p represents an integer of 1 or more.

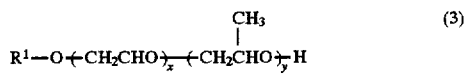

(3)

wherein $R^1$ represents a hydrogen atom or an alkyl group having 1 to 9 carbon atoms, x and y each represents a mole number which is necessary for making the average molecular weight of the compound of the formula (3) 250 or more, and x/y is 0.5 to 2.

7. The process according to claim 1, wherein the compound having a mercapto group or a thione group is a compound represented by the formula (4):

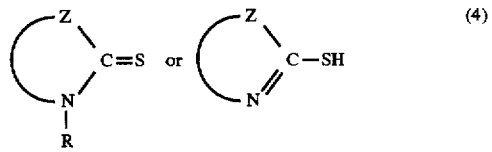

(4)

wherein R represents a hydrogen atom or an alkyl group, aryl group or alkenyl group having 12 or less carbon atoms, and Z represents atomic groups necessary for forming a 5- or 6-membered heterocyclic ring together with N and C in the formula.

8. The process according to claim 7, wherein the compound represented by the formula (4) is selected from the group consisting of 2-mercapto-4-phenylimidazole, 2-mercapto-1-benzylimidazole, 2-mercapto-benzimidazole, 1-ethyl-2-mercapto-benzimidazole, 2-mercapto-1-butyl-benzimidazole, 1,3-diethyl-benzimidazoline-2-thione, 1,3-dibenzyl-imidazolidine-2-thione, 2,2'-dimercapto-1,1'-decamethylene-diimidazoline, 2-mercapto-4-phenylthiazole, 2-mercapto-benzothiazole, 2-mercaptonaphthothiazole, 3-ethyl-benzothiazoline-2-thione, 3-dodecyl-benzothiazoline-2-thione, 2-mercapto-4,5-diphenyloxazole, 2-mercaptobenzoxazole, 3-pentyl-benzoxazoline-2-thione, 1-phenyl-3-methylpyrazoline-5-thione, 3-mercapto-4-allyl-5-pentadecyl-1,2,4-triazole, 3-mercapto-5-nonyl-1,2,4-triazole, 3-mercapto-4-acetamide-5-heptyl-1,2,4-triazole, 3-mercapto-4-amino-5-heptadecyl-1,2,4-triazole, 2-mercapto-5-phenyl-1,3,4-thiadiazole, 2-mercapto-5-phenyl-1,3,4-thiadiazole, 2-mercapto-5-n-heptyl-oxathiazole, 2-mercapto-5-phenyl-1,3,4-oxadiazole, 2-mercapto-5-n-heptyl-1,3,4-oxadiazole, 5-mercapto-1-phenyl-tetrazole, 2-mercapto-5-nitropyridine, 1-methyl-quinoline-2(1H)-thione, 3-mercapto-4-methyl-6-phenyl-pyridazine, 2-mercapto-5,6-diphenyl-pyrazine, 2-mercapto-4,6-diphenyl-1,3,5-triazine, 2-amino-4-mercapto-6-benzyl-1,3,5-triazine and 1,5-dimercapto-3,7-diphenyl-S-triazolino[1,2-a]-S-triazoline.

9. The process according to claim 8, wherein the compound represented by the formula (4) is 2-mercapto-5-n-heptyl-1,3,4-oxadiazole or 2-mercapto-5-phenyl-1,3,4oxadiazole.

10. The process according to claim 1, wherein the compound represented by the formula (1) is a sulfonated compound of a copolymer of styrene and maleic anhydride, having a styrene/maleic anhydride ratio of 1/1 to 4/1 and a number average molecular weight of 20000 or less.

* * * * *